United States Patent [19]

Chen et al.

[11] Patent Number: 4,800,420
[45] Date of Patent: Jan. 24, 1989

[54] TWO-TERMINAL SEMICONDUCTOR DIODE ARRANGEMENT

[75] Inventors: James C. Chen, Torrance; Wah S. Wong, Montebello; Cheng K. Pao, Torrance, all of Calif.

[73] Assignee: Hughes Aircraft Company, Los Angeles, Calif.

[21] Appl. No.: 49,875

[22] Filed: May 14, 1987

[51] Int. Cl.$^4$ .................... H01L 23/36; H01L 23/14; H01L 21/84
[52] U.S. Cl. ......................... 357/76; 357/56; 357/81; 357/71
[58] Field of Search ................ 357/56, 76, 3, 13, 14, 357/52, 81, 71, 86, 42, 68, 55

[56] References Cited

U.S. PATENT DOCUMENTS

| | | | |
|---|---|---|---|
| 4,127,830 | 11/1978 | Chalifour et al. | 357/56 |
| 4,214,255 | 7/1980 | Neilson | 357/56 |
| 4,315,275 | 2/1982 | Bert et al. | 357/56 |
| 4,490,735 | 12/1984 | Schwaderer | 357/56 |
| 4,499,659 | 2/1985 | Varteresian et al. | 357/81 |
| 4,596,069 | 6/1986 | Bayraktaroglu | 357/76 |
| 4,734,749 | 3/1988 | Levi | 357/74 |

FOREIGN PATENT DOCUMENTS

| | | | |
|---|---|---|---|
| 2100925 | 1/1983 | United Kingdom | 357/81 |
| 2151079 | 7/1985 | United Kingdom | 357/56 |

Primary Examiner—Andrew J. James
Assistant Examiner—Sheila V. Clark
Attorney, Agent, or Firm—Terje Gudmestad; P. M. Coble; A. W. Karambelas

[57] ABSTRACT

A two-terminal semiconductor diode device and method for manufacturing the same is disclosed. The semiconductor diode geometry is defined by mesa etching. An ohmic contact is disposed on the flat topped summit of the mesa and another ohmic contact in the shape of a ring is disposed on the bottom layer of the diode. A dielectric layer disposed over the diode has a via hole therethrough to make external contact to a metallic heat sink and ground. A substrate layer supports the semiconductor diode and has a second offset via hole therethrough to the ring contact for external circuit contact and biasing of the diode.

The offset via hole simplifies the manufacturing process. Additionally, the active area of the diode makes direct contact to the heat sink improving heat transfer from the device.

18 Claims, 3 Drawing Sheets

TWO-TERMINAL SEMICONDUCTOR DIODE ARRANGEMENT

BACKGROUND OF THE INVENTION

1. Field of the Invention

The invention relates generally to semiconductor devices and more particularly to two-terminal diode devices employing offset via holes and methods for manufacturing the same.

2. Description of Related Art

Traditionally, two-terminal semiconductor devices have been packaged using direct via hole metallization. The semiconductor device consists of a diode chip, a semi-insulating substrate having a via hole extending vertically therethrough and a metal heat sink which fills the via hole. The diode chip is located on the metal heat sink, which also serves to ground the diode chip. In the above packaging arrangement, however, etching of the via hole is extremely difficult to control. The diode typically has three layers, wherein the layer adjacent the substrate is only typically 5 microns thick. A via hole must be etched through the substrate to this diode layer without etching this 5 micron thick layer away. Additionally, the metal heat sink is not efficient because of its limited size.

In order to solve the heat removal problem, an enlarged via hole configuration was developed. Since the via hole is increased in size, more metal may be located under the diode which enhances heat transfer efficiency. Unfortunately, parasitic inductance is also increased. Next in the evolutionary process, the integral packaging two-terminal device was developed. The active layer of the diode is placed directly on the heat sink, and the diode and heat sink are embedded in a thick polyimide layer. Because of the low thermal conductivity of the polyimide, heat removal from the diode is not efficient and therefore the device cannot operate for sustained periods of time. Additionally, the packaging is not monolithic because it does not have a semi-insulating substrate, and therefore this packaging scheme is not compatible with monolithic circuits.

SUMMARY OF THE INVENTION

It is therefore an object of this invention to provide a two-terminal semiconductor diode arrangement with low parasitic inductance, yet efficient heat transfer.

It is a further object of this invention to provide a two-terminal semiconductor diode arrangement that is monolithic.

It is still a further object of this invention to provide an improved method for manufacturing low cost, high yield two-terminal semiconductor diode arrangements.

In accordance with the foregoing objects, a two-terminal semiconductor diode arrangement according to the present invention includes a semi-insulating substrate having a semiconductor diode located thereon. The semiconductor diode has a lower portion and an upper portion. The lower portion has an annular upper surface encircling the base of the upper portion. A first metal contact makes electrical contact to the semiconductor upper portion, and a second metal contact in the shape of a ring makes electrical contact to the annular upper surface of the lower portion of the semiconductor. A layer of dielectric material overlies the diode and the two metal contacts. A first external contact extends through the dielectric layer to make electrical contact with the first metal contact. A second external contact extends through the substrate and the lower portion of the semiconductor diode to make electrical contact with the metal contact ring.

In fabricating such a semiconductor diode arrangement in accordance with the method of the invention after first forming the aforementioned semi-insulating substrate at least two layers of semiconductor material are grown; a first layer of semiconductor material is grown over the semi-insulating substrate, and a second layer of semiconductor material is grown over the first layer of semiconductor material. A first metal contact is deposited on the second layer in a predetermined shape. Using a photoresist pattern slightly larger than the first contact as a masking member, the second layer and a thin slice of the first layer are etched away forming the upper portion of the semiconductor diode. A ring of metallic contact material is deposited on the first layer, encircling the base of the upper portion, forming a second contact. In a second etching step using a photoresist pattern slightly larger than the second contact as a mask, the first layer is etched down to the semi-insulating substrate. A layer of dielectric material is deposited over the semi-insulating substrate, semiconductor material, and metal contacts. Material is removed from the substrate layer and semiconductor diode to form a first hole extending therethrough exposing an area of the metal ring. An external metal contact is deposited on the substrate extending into the first hole and making electrical contact to the metal ring. In a second removing step, material is removed from the dielectric layer to form a hole extending therethrough to expose an area of the first metal contact. Metal is deposited on the dielectric layer and on the exposed metal filling the second hole.

Other and further objects, advantages and characteristic features of the present invention will become readily apparent from the following description of the preferred embodiments of the invention when considered in conjunction with the accompanying drawings.

DETAILED DESCRIPTION

Figure 1:
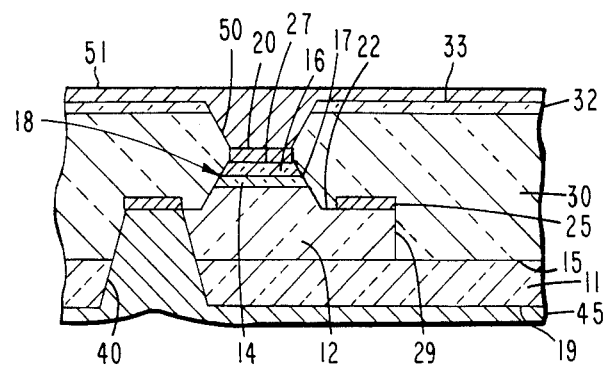
FIG. 1 is a cross-sectional view of a two-terminal semiconductor diode arrangement in accordance with the invention.
Figure 2:
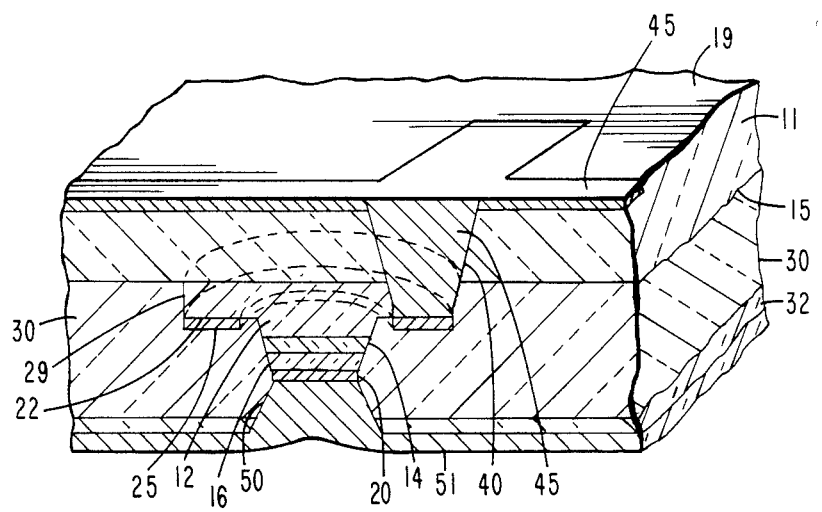
FIG. 2 is a perspective view of a two-terminal semiconductor diode arrangement in accordance with the invention.

Referring now with greater particularity to FIGS. 1 and 2, there is shown a semi-insulating substrate 11 having top and bottom major surfaces 15 and 19. The semi-insulating substrate 11 is typically four mils in final thickness, and may be made of gallium arsenide, indium phosphide or any other III-V semiconductor material. A semiconductor diode 18 is located on the top major surface 15 of the semi-insulating substrate 11. The semiconductor diode 18 has an upper portion 17 and a lower portion 29. Upper portion 17 has a substantially frusto-conical shape with top surface 27. Lower base portion 29 has the shape of a disk. The disk shaped base portion 29 has an annular upper surface 22 which extends outwardly from the base of the substantially frusto-conical upper portion 17. The top surface 27 of the upper portion 17 and the annular upper surface 22 of the lower base portion 29 form planes that are substantially parallel.

The semiconductor diode typically consists of three semiconductor layers, a first layer 12 located adjacent to the semi-insulating substrate top major surface 15, the first layer typically being of an N+ conductivity type; a second middle layer 14 which is typically of an N-type conductivity; and a third layer 16 which may be either of a P+ conductivity type or N+ conductivity type, depending on the ultimate diode device desired. Using a Gunn diode as an example, the first layer 12 is of an N+ conductivity, the second layer 14 of N conductivity and the third top layer 16 of N+ conductivity. For the Gunn diode, the doping concentration for the first layer 12 is typically $1 \times 10^{18}$ ions per centimeter cubed, for the middle layer 14 is typically $1 \times 10^{16}$ ions per centimeter cubed, and the doping concentration for the third layer 16 is typically $1 \times 10^{18}$ ions per centimeter cubed. The first N+ layer 12 is typically about 10 microns or more in thickness, which reduces the series resistance of the diode. The thickness of the second middle layer 14 is typically about one to two and one-half microns, and the third layer 16 is typically about 0.5 microns thick, for example. The second middle layer 14 serves as a transit layer within which Gunn domain will form. Other types of two-terminal semiconductor diodes may also be used such as varactor diodes or impatt diodes, for example.

A metal contact 20 in the shape of a disc is located on and makes electrical contact to the top surface 27 of the substantially frusto-conical upper portion 17. A second metal contact 25 in the shape of a ring is located on and makes electrical contact to the annular upper portion 22 of the disc shaped base portion 29. The metal contact ring 25 is spaced from the base of the substantially frusto conical upper portion. The metal contact ring typically has an inner diameter of 2.4 mil and outer diameter of 6.0 mil, and is about 0.6 microns thick.

A dielectric layer 30 is deposited over the diode 18, metal contacts 20 and 25 and top major surface 15 of the semi-insulating substrate 11. The dielectric layer 30 is typically about one and one-half to two times the thickness of the first layer 12, which is typically about 5 to 10 microns thick. The dielctric layer may consist of a layer of polyimide 30, and a layer of silicon nitride or silicon dioxide 32, as shown in FIG. 1. The polyimide layer 30 is typically about 10-20 microns thick and silicon nitride or silicon oxide about 0.2-0.5 microns thick, for example. The dielectric layers protect the semiconductor diode 18 and also provide a flat surface 33 for forming a gold plated heat sink later in the process.

An offset via hole 40 extends through the semi-insulating substrate 11 and the lower disc shaped base portion 29 of the semiconductor diode 18 exposing a portion of the metal ring contact 25. The via hole 40 is offset from its conventional position. A transmission line 45 made out of conductive material sits on the bottom surface 19 of substrate 11 and crosses over the offset via hole 40. The transmission line 45 extends into via hole 40 and makes electrical contact to the metal ring contact 25. The transmission line 45 provides the necessary matching of the semiconductor diode 18 to other circuit components and also facilitates biasing of the diode.

A second via hole 50 extends through dielectric layers 30 and 32 to expose the first metal contact 20. A metal layer 51 overlies the dielectric layer surface 33 and extends into the second via hole 50 making electrical and thermal contact to first contact 20. This metallization provides heat removal from the diode 18 and also provides the ground plane for diode 18. The metal layer 51 is typically 2-3 mils thick.

It should be noted that the structures illustrated in the above figures represent an individual two-terminal device, and that the semi-insulating substrate may actually contain a large plurality of such structures, the substrate being cut into small chips to form the individual two-terminal devices during the final step in the fabrication process described herein. Additionally other active devices such as planar Schottky barrier mixer diodes and PIN switch diodes for example, may be fabricated on the bottom surface 19 of substrate 11 and electrically coupled to diode 18 to provide an integrated millimeter wave receiver or transmitter system.

In summary a two-terminal semiconductor diode arrangement is described above employing an offset via hole 40 and metal ring contact 25 which simplifies processing and eliminates stringent tolerance requirements mandated by prior two-terminal device packages. Heat transfer efficiency is also improved. Moreover, two-terminal diode arrangements embodying the invention may be fabricated by relatively low cost, high yield processes.

A two-terminal diode arrangement fabricated according to a preferred method is illustrated in FIG. 3 (a-j). Components in the embodiment of FIG. 3 which are the same as or equivalent to respective components in the embodiment of FIGS. 1 and 2 are designated by the same second and third reference numeral digits as their corresponding components in FIGS. 1 and 2 along with the addition of a prefix numeral "1".

Figure 3A:
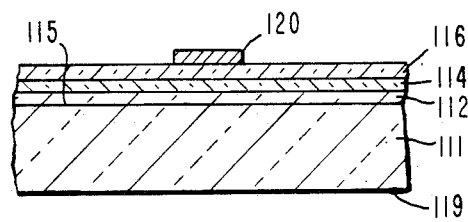
FIGS. 3a-j are a series of pictorial cross-sectional views of a two-terminal semiconductor diode arrangement illustrating the steps in the fabrication of the device in accordance with the method of the present invention.

FIG. 3a through 3j illustrates sequential steps in the fabrication of the two-terminal diode arrangement. A Gunn diode will be used as an example. The fabrication process also applies to any other diode such as varactor diodes or impatt diodes, for example. Referring to FIG. 3a, a two-terminal diode arrangement is produced starting with a semi-insulating substrate 111, which may be ten to fifteen mils thick gallium arsenide substrate, for example. A first heavily doped semiconductive layer 112 is formed on substrate 111. The semiconductive layer 112 is preferably an n+ type gallium arsenide, for example. The heavily doped semiconductive layer 112 may be formed by conventional vapor phase epitaxy (VPE) or molecular beam expitaxy (MBE) techniques. Alternatively, the heavily doped semiconductor layer may also be formed by known metal oxide chemical vapor deposition (MOCVD) or deep ion implantation techniques. A doping level for semiconductor layer 112 ranges from $1 \times 10^{18}$ to $2 \times 10^{18}$ ions per centimeter cube and its thickness is typically about 10 microns.

A second layer of lightly doped semiconductive material 114, which is of the same conductivity type as the first layer 112, is formed on top of the first semiconductor layer 112. For example, the lightly doped semiconductive layer 114 is preferably n-type gallium arsenide, and may also be formed by known VPE, MOCVD or MBE techniques. The second layer 114 preferably has a silicon dopant with a doping level at about $1 \times 10^{16}$ ions per centimeters cubed and may be 1.0 to 2.5 microns in thickness. The second layer 114 serves as a transit layer within which Gunn domain will form.

A third layer 116 of heavily doped semiconducting material is formed on top of the second layer 114. The heavily doped third layer 116 is an n+ doped gallium aluminum in the case of a Gunn diode. This heavily doped third layer may be formed by conventional VPE, MOCVD or MBE techniques. The third layer has a thickness of about 0.5 microns and the doping level for the semiconductor layer may range from about $1 \times 10^{18}$ to about $2 \times 10^{18}$ ions per centimeter cubed.

After the semiconductor layers have been formed, a photoresist layer (not shown) is applied on the third layer. By conventional photolithographic techniques, photoresist layer is then selectively exposed and developed to provide a patterned opening defining a first metal contact for the diode arrangement. The patterned opening is typically circular in shape. Metal, such as gold-germanium, nickel and gold are successively deposited over the photoresist forming first contact 120. The photoresist and excess metal are thereafter removed with acetone.

Figure 3B:
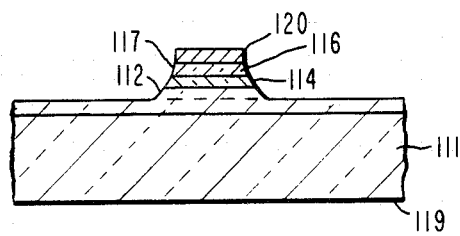

Next, as illustrated in FIG. 3b, the third layer 116, second layer 114 and a thin slice of the first layer 112 are removed. A photoresist pattern (not shown) aligned over and slightly larger than the first metal contact 120 (formed in the previous step) is used as a mask. A chemical etchant such as $H_2SO_4$ and $H_2O_2$ of proper proportions is used to etch the exposed third layer 116, the second layer 114 and a thin slice of the first layer 112, thereby keeping the bulk thickness of the first layer 112 intact. A substantially frusto-conically shaped upper portion 117 of semiconductor material is formed by this etching process.

Figure 3C:
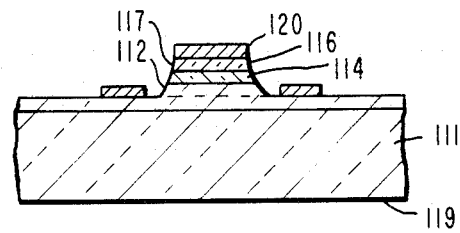

In the next step, a second photoresist layer (not shown) is applied over the first layer 112 semiconductor material including the metal contact 120. The photoresist is exposed and developed to provide a patterned opening for a metal ring-shaped contact 125 on the semiconductor first layer 112. Gold-germanium, nickel, and gold are successively deposited over the photoresist layer by E-beam evaporation. The photoresist layer and excess metal are thereafter removed with acetone. This leaves a metal ring contact 125 around the base of the substantially frusto-conical upper portion 112. The metal ring contact 125 serves as the ohmic contact for the first semiconductor layer 112, as illustrated in FIG. 3c.

Figure 3D:
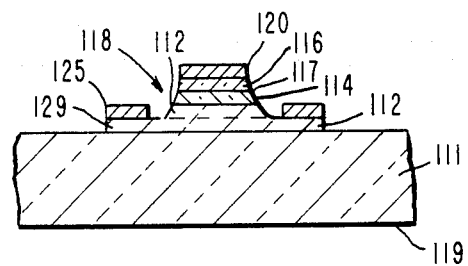

Following the formation of the metal contact ring 125, the first layer 112 is etched down to the semi-insulating substrate 111 as illustrated in FIG. 3d. A photoresist mask pattern slightly larger than the metal contact ring 125 is applied and the first layer 112 is etched away. On the semi-insulating substrate, this etching step forms lower base portion 129 on layer 111 which has the shape of a disc.

Figure 3E:
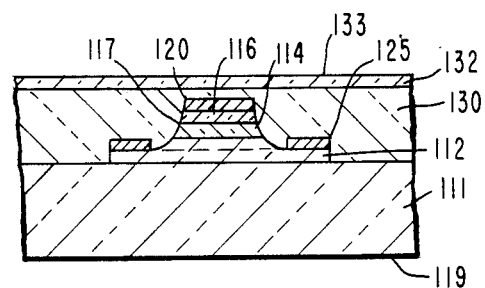
Figure 3F:
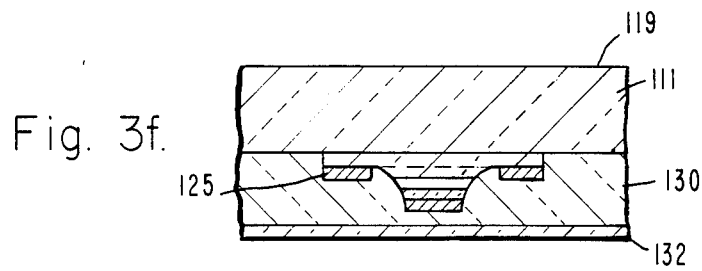

In the next step, FIG. 3e, a layer of dielectric material such as polyimide, for example, is deposited over the semiconductor diode 118, metal contacts 120 and 125 and semi-insulating substrate 111. The polyimide layer 130 has a thickness of about one and one-half to two times the thickness of the first semiconductor layer 112. After the deposition and curing of the polyimide layer 130, a thin layer 132 of either silicon dioxide or silicon nitride is deposited over the polyimide layer 130. Layer 132 is typically about 0.2-0.5 microns in thickness and has an upper surface 133 which is essentially flat.

The semiconductor structure fabricated to this point is now turned over and the bottom surface substrate layer 111 is lapped and polished to a thickness of about four mils, for example. See FIG. 3f.

Using infrared mask alignment techniques, a photoresist mask (not shown) is formed on surface 119 of substrate layer 111 having a patterned opening therethrough which is in line with a portion of the metal contact ring 125. The exposed region of the substrate layer 111 is etched by chemical etching employing a solution of $H_2SO_4$ and $H_2O_2$, or by reactive ion etching (RIE) technique, wherein the reactive ions are generated from a mixture of FREON 12 ™ and argon. The latter dry etching procedure is preferred to produce more uniformly etched via holes. The etching is continued until a hole 140 through substrate 111 has been made exposing an area of the metal contact ring 125.

Figure 3G:
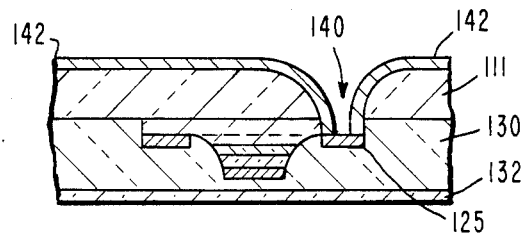
Figure 3H:
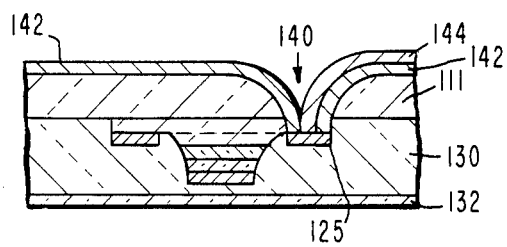

In the next step, shown in FIG. 3g, the transmission line and via hole 140 are metallized. A photoresist layer (not shown) is applied on the substrate layer 111 having patterned opening for the transmission line 142 and 144 shown in FIG. 3h and via hole 140. A metal layer 142 of titanium and gold is deposited over the photoresist open areas by E-beam evaporation, for example, to a thickness of about 0.05 micron and 1 micron, respectively, for example. Thereafter, as shown in FIG. 3h, the metal layer 142 in the via hole 140 and metal on the bias line are selectively built up to a thickness of about three to five microns by electroplating a layer 144 of gold over them.

Figure 3I:
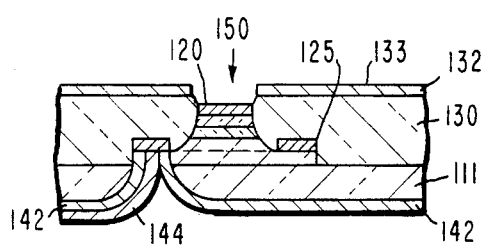
Figure 3J:
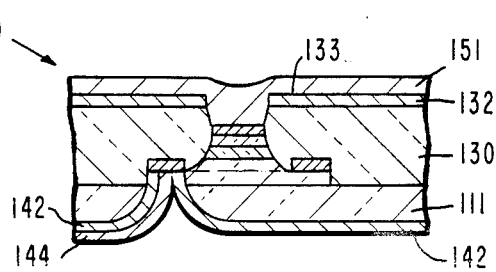

After metallizing the back side of the two-terminal diode arrangement, a photoresist layer (not shown) is applied over surface 133 of layer 132 with an opening vertically in line with the first metal contact 120. The exposed region of layer 132 is etched by wet chemistry employing a solution of buffered (HF) hydrofluoric acid. The etching is continued until the silicon nitride or silicon dioxide layer 132 has been removed. Thereafter using dry oxygen plasma etching, the exposed dielectric layer 130 is removed leaving a hole 150 vertically through to the first metal contact 120 as illustrated in FIG. 3i. The photoresist is removed during the plasma etching process. Thereafter titanium and gold is sputtered over layer 132 and into hole 150 to a thickness of about 0.05 microns and 0.2 microns, respectively, and then gold is electroplated onto the titanium and gold to a thickness of about two to three mils forming metal layer 151, as shown in FIG. 3j.

A two-terminal diode arrangement is thus fabricated by low cost, high yield processing techniques. Employing the offset via hole eliminates the stringent via hole tolerance requirements of a conventional two-terminal diode arrangement. Although the invention has been shown and described with reference to particular illustrated embodiments, nevertheless, various changes and modifications obvious to a person skilled in the art to which the invention pertains is deemed to lie within the purview of the invention.

What is claimed is:

1. A two-terminal semiconductor diode arrangement, comprising:
   a semi-insulating substrate having first and second major surfaces;
   a semiconductor diode located on the first major surface of said semi-insulating substrate, said diode having an upper portion and a lower base portion, the lower base portion having an annular upper surface extending outwardly from the base of the upper portion;

a first metal contact in electrical contact with the upper portion of said semiconductor diode;

a second metal contact in the shape of a ring located on and making electrical contact to the annular upper surface of the lower base portion;

a layer of dielectric material disposed over said semiconductor diode, first and second metal contacts, and first major surface of said substrate, said dielectric layer having a first hole therethrough to said first metal contact;

metallic heat sink means thermally and electrically coupled to said first metal contact through said first hole, said semi-insulating substrate and lower base portion having a second offset hole extending vertically therethrough to said ring-shaped metal contact; and a metallic bias line making electrical contact to said second ring-shaped contact through said second offset hole.

2. A two-terminal diode arrangement as defined in claim 1 wherein said upper portion is substantially frusto-conical in shape and said lower base portion is substantially disc shaped.

3. A two-terminal diode arrangement as defined in claim 1 wherein said upper portion is of a first conductivity type and said lower base portion is of a second opposite conductivity type.

4. A two-terminal diode arrangement as defined in claim 1 wherein said semiconductor diode includes three layers: a bottom layer adjacent to said substrate of N+ conductivity, a middle layer adjacent to the bottom layer of N conductivity, and a top layer adjacent to said middle layer of N+ conductivity.

5. A two-terminal diode as defined in claim 1 wherein said semiconductor diode includes three layers: a bottom layer adjacent to said substrate of N+ conductivity, a middle layer adjacent to the bottom layer of N conductivity and a top layer adjacent to said middle layer of P+ conductivity.

6. A two-terminal diode arrangement as defined in claim 1 wherein said dielectric layer is made of polyimide.

7. A two-terminal diode arrangement as defined in claim 6 further comprising a layer of silicon dioxide over said dielectric layer.

8. A two-terminal diode arrangement as defined in claim 6 further comprising a layer of silicon nitride over said dielectric layer.

9. A two-terminal diode arrangement as defined in claim 1 further comprising means for biasing said semiconductor diode.

10. A two-terminal diode arrangement as defined in claim 1 wherein said semiconductor diode is made of III-V semiconductor material.

11. A two-terminal diode arrangement as defined in claim 10 wherein said semiconductor diode is made of gallium arsenide.

12. A two-terminal diode arrangement as defined in claim 10 wherein said semiconductor diode is made of indium phosphide.

13. A two-terminal diode arrangement, comprising:

a semi-insulating substrate having first and second essentially parallel major surfaces;

a semiconductor diode located on the first major surface of said semi-insulating substrate, said diode having an upper disc-shaped portion and a lower disc-shaped base portion, the lower base portion having an upper surface extending outwardly from the base of the upper portion;

a first electrical contact on the upper portion of said semiconductor;

a metal contact in the shape of a ring making electrical contact to the upper surface of the lower base portion;

a layer of dielectric material overlying said semiconductor diode having a first hole extending vertically therethrough to said first electrical contact;

a metallic heat sink extending into and filling said first via hole and contacting said first electrical contact;

said substrate having a second offset hole extending vertically through said substrate and said lower base portion to said ring-shaped metal contact; and a metallic bias contact extending into and filling said second offset via hole making electrical contact to said ring-shaped metal contact.

14. A two-terminal diode arrangement as defined in claim 13 wherein said upper surface of lower base portion extends annularly around the base of the upper portion and said second metal contact is in the shape of a ring making electrical contact to the annular upper surface.

15. A two-terminal diode arrangement as defined in claim 13 wherein said upper portion is substantially frusto-conical in shape and said lower portion is substantially disk shaped.

16. A two-terminal diode arrangement as defined in claim 13 wherein said diode includes three layers, a layer adjacent the substrate of N+ conductivity-type, a middle layer adjacent the bottom layer of N+ conductivity and a top layer adjacent the middle layer of an N+ conductivity-type.

17. A two-terminal diode arrangement as defined in claim 13 wherein said semiconductor diode includes three layers, a bottom layer adjacent to the substrate of N+ conductivity, a middle layer adjacent the bottom layer of N-type conductivity, and a top layer adjacent the middle layer of P+ conductivity.

18. A two-terminal diode arrangement as defined in claim 13 further comprising means for biasing said semiconductor diode.

* * * * *